United States Patent [19]

Kono et al.

[11] Patent Number: 4,766,088
[45] Date of Patent: Aug. 23, 1988

[54] METHOD OF MAKING A MEMORY DEVICE WITH POLYSILICON ELECTRODES

[75] Inventors: Satoshi Kono, Ikeda; Koshi Nomura, Itami; Mikio Kyomasu, Toyono, all of Japan

[73] Assignee: Ricoh Company, Ltd., Tokyo, Japan

[21] Appl. No.: 899,742

[22] Filed: Aug. 21, 1986

Related U.S. Application Data

[62] Division of Ser. No. 543,996, Oct. 20, 1983, abandoned.

[30] Foreign Application Priority Data

Oct. 22, 1982 [JP] Japan .................. 57-184493

[51] Int. Cl.⁴ .......................................... H01L 21/44
[52] U.S. Cl. ........................... 437/52; 437/43; 437/193; 437/233; 437/49; 156/653
[58] Field of Search .............. 29/571, 591; 357/23.14; 156/653, 657; 437/43, 49, 52, 48, 191, 193, 228, 233

[56] References Cited

U.S. PATENT DOCUMENTS

| | | | |
|---|---|---|---|
| 3,986,896 | 10/1976 | Ueno | 437/49 |
| 4,142,926 | 3/1979 | Morgan | 437/43 |
| 4,178,674 | 12/1979 | Liu et al. | 29/571 |
| 4,291,328 | 9/1981 | Lien et al. | 357/23.9 |
| 4,373,248 | 2/1983 | McElroy | 437/49 |
| 4,373,249 | 2/1983 | Kasa et al. | 437/43 |
| 4,471,373 | 9/1984 | Shimizu | 357/23.5 |
| 4,635,347 | 1/1987 | Lien et al. | 437/43 |
| 4,646,425 | 3/1987 | Owens et al. | 437/43 |

FOREIGN PATENT DOCUMENTS

| | | | |
|---|---|---|---|
| 0206929 | 12/1986 | European Pat. Off. | 437/52 |
| 0015669 | 6/1979 | Japan | 357/23.9 |
| 2081012 | 2/1982 | United Kingdom | 357/23.5 |

Primary Examiner—Brian E. Hearn
Assistant Examiner—Kevin McAndrews
Attorney, Agent, or Firm—Cooper & Dunham

[57] ABSTRACT

A semiconductor memory device is provided with a memory region including SAMOS type memory transistors and a non-memory or peripheral region including MOS transistors which are interconnected to form logic circuits such as decoders for controlling the operation of each of said memory transistors. Each of the transistors includes a pair of first and second doped polysilicon layers and an interlayer insulating film provided as sandwiched between the pair of first and second doped polysilicon layers. In the memory region, the first and second doped polysilicon layers define floating and control gate electrodes, respectively; whereas, in the non-memory region, the first and second doped polysilicon layers are electrically interconnected by a through-the-layer electrode formed through the interlayer insulating film.

6 Claims, 7 Drawing Sheets

METHOD OF MAKING A MEMORY DEVICE WITH POLYSILICON ELECTRODES

This is a division of application Ser. No. 543,996, filed Oct. 20, 1983, now abandoned.

BACKGROUND OF THE INVENTION

1. Field of the Invention

This invention relates to a semiconductor device and a method for manufacturing the same, and more particularly to a semiconductor device including a memory transistor of the SAMOS type having a floating gate and a control gate and a peripheral transistor of the MOS type and a method for manufacturing such a semiconductor device.

2. Description of the Prior Art

Heretofore, wide use has been made of a semiconductor memory including a SAMOS type memory cell in which a control gate is provided above a floating gate, with an insulating layer sandwiched therebetween. In comparison with FAMOS type memory cells, in such a SAMOS type memory, there is a characteristic feature of high reliability in performance such as excellence in controlling write-in voltage and a capability to monitor the write-in condition. The typical structure of a semiconductor memory including such a prior art SAMOS type memory cell is illustrated in FIG. 1.

Figure 1:
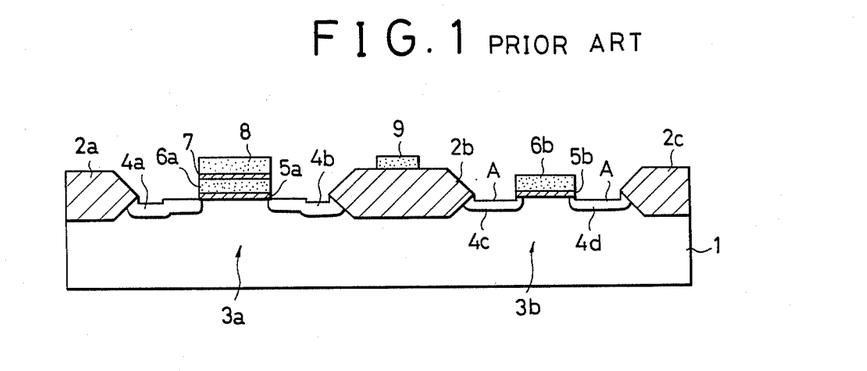
FIG. 1 is a cross-sectional view showing the structure of a prior art semiconductor memory device.

The prior art semiconductor device shown in FIG. 1 includes a substrate 1 comprised of a semiconductor material, typically silicon, in the surface of which are formed field oxides 2a, 2b and 2c thereby defining device regions 3a and 3b between the two adjacent field oxides. In the device region 3a there is formed a SAMOS transistor as a memory cell. That is, in the surface of the device region 3a, diffused regions 4a and 4b are formed by having an impurity opposite in conductivity type to the substrate 1 doped into the substrate 1. Provided on the surface of the substrate as extending between the pair of diffused regions 4a and 4b is an insulating layer 5a, on the surface of which is formed a floating gate 6a which is typically formed by doped polycrystalline silicon, or simply polysilicon. On the floating gate 6a is formed an interlayer oxide film 7, on which is formed a control gate 8 typically from doped polysilicon.

On the other hand, in the device region 3b which is laterally separated from the device region 3a by the field oxide layer 2b, there is formed a common MOS transistor. Stated in greater detail, in the surface of the substrate 1 is formed a pair of diffused regions 4c and 4d spaced apart from each other over a predetermined distance, and, similarly with the case of the diffused regions 4a and 4b, these diffused regions 4c and 4d are also formed by doping an impurity opposite in the type of conductivity to the substrate 1. An insulating layer 5b is formed on the surface of the substrate, extending between the pair of diffused regions 4c and 4d, and a gate 6b, typically of doped polysilicon, is formed on the insulating layer 5a. Furthermore, on the field oxide 2b there is formed an interconnection layer 9 which is used for establishing interconnections between devices formed in device or active regions.

Now, a description will be given of a prior art method for manufacturing the semiconductor device having the structure shown in FIG. 1. In the first place, the surface of the substrate 1 is selectively oxidized in a well-known manner to form the field oxide layers 2a, 2b and 2c thereby defining the device or active regions 3a and 3b. Although not shown in FIG. 1, gate oxidation is carried out after the selective oxidation to form a thin insulating layer formed by an oxide of the substrate 1 across the surface of each of the device regions 3a and 3b. Then, a first layer of polysilicon is formed across the entire surface, which is then patterned. In this instance, the floating gate 6a is formed from the first layer of polysilicon, the rest of which is etched away. Then, thermal oxidation is carried out to have the floating gate 6a of polysilicon paritially oxidized thereby forming the interlayer oxide layer 7. At this time, the gate oxide film for each of the peripheral transistors other than the memory transistors is also formed at the same time. Then, a second layer of polysilicon is formed across the entire surface, which layer is then selectively etched to form the control gate 8 as well as the gate electrode 6b in the device region 3b and the interconnection layer 9 on the field oxide layer 2b. Then, after patterning the interlayer insulating film 7 by etching, the first layer 6a of polysilicon to be formed into a floating gate is etched in self-alignment with the second layer 8 of polysilicon to be formed into a control gate.

Figure 2A:
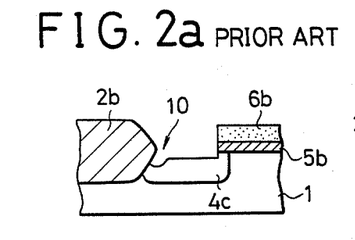
FIGS. 2a-2c are schematic illustrations showing the sequence in which an unwanted metal pattern is formed at the boundary between the field oxide and the diffused region in accordance with the prior art process for manufacturing the structure shown in FIG. 1.
Figure 2B:
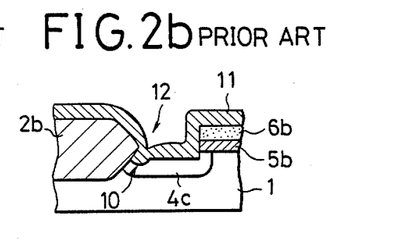
Figure 2C:
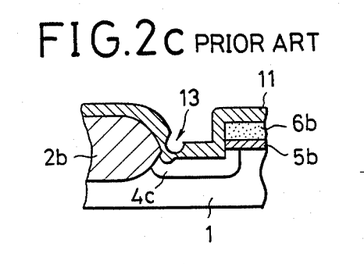

In the prior art manufacturing method as described above, at the step of etching the interlayer insulating film, the substrate 1 is exposed at the diffused regions 4c and 4d in the device region 3b, so that these exposed portions of susbtrate 1 may become damaged at the following etching step by self-alignment. These damaged portions are shown in FIG. 1 as indicated by A. Such damage is disadvantageous because it can be a cause of metal shorting between interconnection lines. With reference to FIGS. 2a-2c and 3, a description will be given of such metal shorting between interconnection lines is produced due to such damage to the substrate 1. As shown in FIG. 2a, when the substrate 1 receives damaged caused by etching, the boundary between the field oxide 2b and the diffused region 4c is most liable to receive such damages and thus a groove 10 is formed as shown. Then, when a PSG layer 11 is formed across the entire surface, a valley 12 is formed at the similar location because of the presence of the groove 10 between the field oxide 2b and the diffused region 4c. Under the condition, if a layer of photoresist is formed and photoetching is carried out to form through-holes for electrical contact at desired locations, since the contact between the photoresist and the PSG layer 11 is poor at the valley 12, the etchant will penetrate into the interstices between the photoresist and the PSG layer 11 thereby causing undesired portions of the PSG layer 11 to be etched. In this manner, as shown in FIG. 2b, a groove 13 is formed in the PSG layer 11 along the side of the field oxide 2b. When metal interconnection is formed on the PSG layer 11 in the next step, metal remains in the groove 13, so that there is formed an unwanted metal pattern 16 along the boundary between the field oxide 2 and the diffused region 4.

Figure 3:
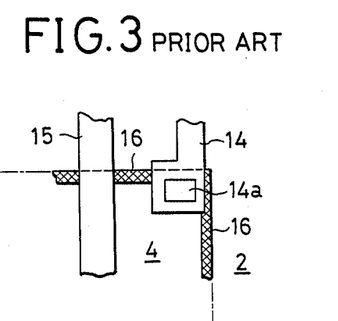
FIG. 3 is a schematic illustration showing the condition in which the two interconnection lines 14 and 15 are shorted by the unwanted metal pattern 16 formed at the boundary between the field oxide 2 and the diffused region 4 in accordance with the prior art process.

As is clear from FIG. 3, such an unwanted metal pattern 16 would cause a metal interconnection 14, which is electrically connected to the diffused region 4 through a contact 14a, to be shorted to another metal interconnection 15 undesirably. In particular, one semiconductor device, has a centrally located memory region in which a number of memory transistors are arranged in the form of a two dimensional array, and a peripheral region surrounding the memory region in which a number of MOS transistors are provided and interconncted to define desired logic circuits such as decoders. In that example, the presence of such an unwanted metal line 16 can be a cause of electrical shorting between interconnection lines which can lower the yield in manufacture of semiconductor devices. Moreover, in the above-described prior art manufacturing method, the interlayer oxide film and the gate oxide film for each peripheral transistor are formed at the same time, so that if these oxide films are to be formed by thermal oxidation, during formation of the floating gate of memory transistor, impurities will flow out from the first layer 6a of polysilicon thereby causing the channel region of the peripheral transistor 3b to be autodoped. As a result, the threshold of the peripheral transistor tends to be more scattered, which also contributes to lowering of the yield.

SUMMARY OF THE INVENTION

Therefore, it is a primary object of the present invention to eliminate the above-described disadvantage of the prior art.

Another object of the present invention is to provide a semiconductor device in which the electical resistance of interconnection line and an to increase in operational speed is thereby achieved.

A further object of the present invention is to provide a semiconductor device in which the degree of freedom in designing an interconnection pattern in the peripheral region, in which a complicated interconnection is required, is considerably increased.

A still further object of the present invention is to provide a semiconductor memory device and a method for manufacturing the same capable of preventing the substrate in the peripheral region around the memory region from receiving damages.

A still further object of the present invention is to provide a method for manufacturing a semiconductor device capable of preventing the occurrence of autodoping (during the thermal oxidation step for forming a gate oxide film of a MOS transistor) in the peripheral region on one chip.

Other objects, advantages and novel features of the present invention will become apparent from the following detailed description of the invention when considered in conjunction with the accompanying drawings.

DESCRIPTION OF THE PREFERRED EMBODIMENTS

Figure 4:
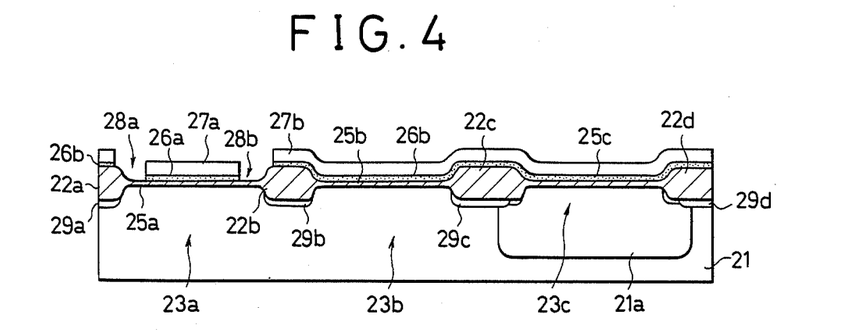
FIGS. 4–11 are cross-sectional views showing the structure of a semiconductor device at each step of its manufacturing process in accordance with one embodiment of the present invention.

Now, with reference to the embodiments shown in the drawings, the present invention will be described more in detail. FIGS. 4–11 show several steps in a process for manufacturing a semiconductor device in accordance with one embodiment of the present invention. As shown in FIG. 4, a semiconductor substrate 21 is comprised, for example, of a semiconductor material which is lightly doped with a P type impurity, and an N well 21a is formed at a selected portion of the semiconductor substrate 21 by doping with an impurity opposite in conductivity type to the substrate 21. The surface of such a semiconductor substrate 21 is subjected to the well-known selective oxidation, and, thus, field oxides 22a, 22b, 22c and 22d are formed at selected locations. With the formation of such field oxides 22a–22d, device regions 23a, 23b and 23c are defined between any two adjacent field oxides. As will become clear later, a SAMOS type memory transistor will be formed in the device region 23a; on the other hand, N-channel and P-channel MOSFETs will be formed in the device regions 23b and 23c, respectively. It is to be noted that, as a semiconductor material for forming the substrate 21, use may be made of silicon, but the present invention should not be limited only to such a particular material.

With the application of selective oxidation, across the surface of substrate 21 in each of the device regions 23a–23c there is formed an insulating layer 25a, 25b or 25c of approximately 700 angstroms in thickness, which is a thermally oxidized portion of the substrate. Below each of the field oxides is provided a channel stopper 29a, 29b, 29c or 29d.

After selective oxidation, a first layer 26 of polysilicon is formed approximately to the thickness of 1,600 angstroms by depositing polysilicon doped with phosphorus across the entire surface of the substrate 21. Then, after forming a photoresist layer 27 on the first layer 26 of polysilicon, predetermined patterning is carried out only in the device region 23a in which a memory transistor is to be formed. Then, as shown in FIG. 4, only those portions of the first layer 26 of polysilicon which are indicated by 28a and 28b are removed by etching thereby defining a first polysilicon layer portion 26a having a desired pattern. In the device regions 23b and 23c, in which peripheral transistors other than memory transistors are to be formed, another first polysilicon layer portion 26b is left intact. As will become clear later, the reason why the first polysilicon layer 26 is patterned to form the above-described first polysilicon layer portion 26a only in the memory region is that the first polysilicon layer portion 26a will be used to define an individual floating gate in each device region 23a.

Figure 12:
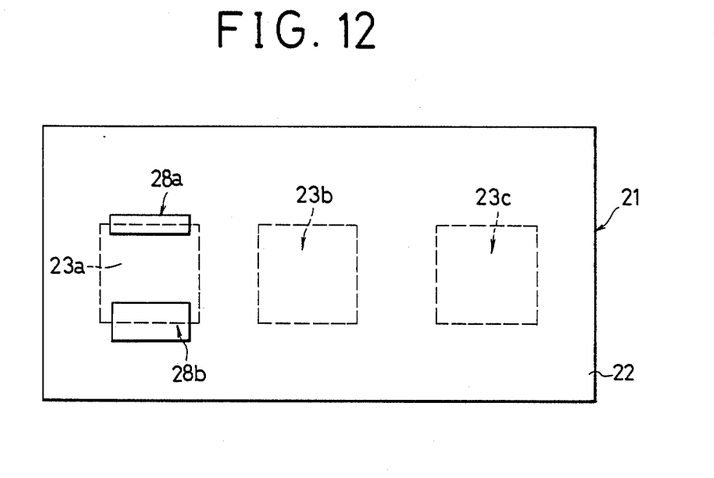
FIGS. 12–15 are plan views which correspond to the structures shown in FIGS. 4–7, respectively.

FIG. 12 schematically illustrates in plan view the structure of FIG. 4. It is to be noted, however, that the memory device region 23a shown in FIG. 4 is rotated over 90° as compared with the memory device region 23a shown in FIG. 12. As shown in FIG. 12, in the surface of semiconductor substrate 21 is formed a field oxide 22 which then defines the device regions 23a, 23b and 23c as indicated by the dotted lines. In these device regions 23a–23c desired devices will be formed as will be made clear later. Also shown in FIG. 12 is a pair of cut-away portions 28a and 28b from which the first polysilicon layer 26 is removed by etching. With such a pair of cut-away portions 28a and 28b formed spaced apart from each other over a predetermined distance only in the memory device region 23a in which a memory transistor is to be formed, the first polysilicon layer from which a floating gate is to be formed becomes discontinued in the longitudinal direction thereby allowing to form individual floating gates in respective device regions. In other words, though FIG. 12 shows only schematically, in a typical semiconductor memory device, a plurality of memory transistors are usually arranged in the form of two dimensional array having M rows and N columns, in which case, the pair of cut-away portions 28a and 28b may be advantageously used to discontinue the floating gates between the two adjacent memory transistors or cells. As described previously, after formation of the field oxide 22 with the application of selective oxidation to the substrate 22, in the substrate surface of each of the device regions 23a, 23b and 23c there is formed an oxide film of approximately 700 angstroms by applying HCl oxidation at the temperature of approximately 1,050° C.

Figure 5:
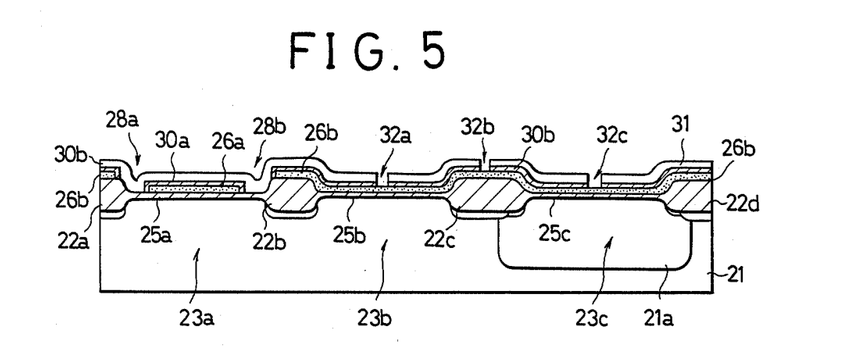
Figure 13:
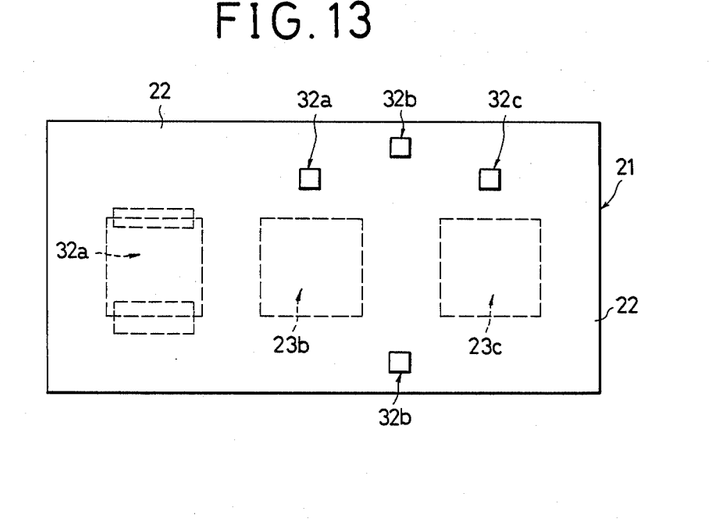

After patterning the first polysilicon layer 26 as described above, the photoresist layer 27 is removed, and then, as shown in FIG. 5, the structure is subjected to thermal oxidation at the temperature of approximately 1,050° C. in the environment of dry oxygen, thereby causing the surface portion of each of the remaining first polysilicon layers 26a and 26b to be oxidized to form second oxide films 30a and 30b approximately to the thickness of 700 angstroms. Then, a photoresist layer 31 is again formed across the entire surface, and with the application of photoetching, holes 32a, 32b and 32c are formed as extending through the photoresist layer 31 and the second insulating layer 30, thereby causing the first polysilicon layer 26 to be exposed at the respective locations. FIG. 13 is a plan view of the structure shown in FIG. 5. It is to be noted that the portion of the device region 23a shown in FIG. 5 is shown after 90° rotation in FIG. 13; moreover, although holes 32a and 32c are shown as located above the respective device regions 23b and 23c, these holes are shown as located above the field oxide in FIG. 13. As will be made clear from the following description, holes such as 32a and 32c are in practice provided above the field oxide and not above the respective device regions. Although not shown in FIG. 5 specifically, the application of thermal oxidation for the formation of the second oxide film 30 also forms an additional thermal oxide film having a slight thickness in the cut-away portions 28a and 28b. Thus, although the second oxide film portions 30a and 30b are shown as physically separated from each other in FIG. 5, they are in fact connected by such a thin oxide film.

Figure 6:
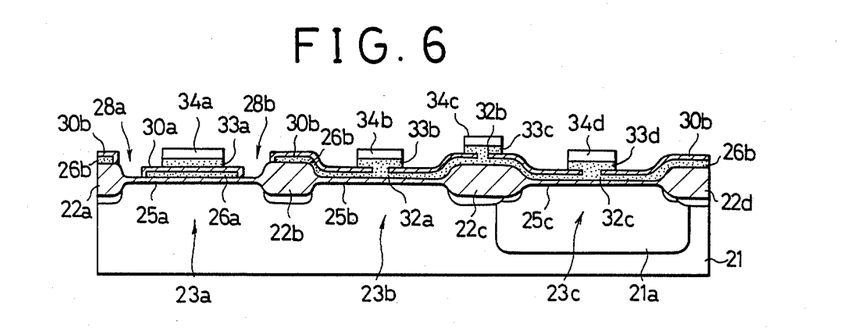

Then, after removal of the photoresist layer 30, phosphorus doped polysilicon is deposited onto the entire surface approximately to the thickness of 3,500 angstroms to form a second polysilicon layer 33. Similarly with the case of the first polysilicon layer 26, the second polysilicon layer 33 may be formed, for example, by using the low pressure chemical vapor deposition (CVD) at the temperature of approximately 630° C. After formation of the second polysilicon layer 33 as described above, a photoresist layer 34 is formed across the entire surface. And, then, using any well-known photoetching technique, the photoresist layer 34 and the second polysilicon layer 33 are selectively etched to obtain a structure as shown in FIG. 6. In other words, in the memory device region 23a, a second polysilicon layer portion 33a is formed and is electrically isolated from the floating gate 26a, which is formed from the first polysilicon layer, by the second oxide film 30a, and the second polysilicon layer portion 33a will function as the control gate of the resulting memory transistor. On the other hand, in the device regions 23b and 23c, in which MOS transistors are to be formed, there are formed second polysilicon layer portions 33b and 33d which are electrically connected to the first polysilicon layer 26b through the holes 32a and 32c, respectively. These second polysilicon layer portions 33b and 33d will form a part of the gate electrode of each of the resulting MOS transistors.

Figure 14:
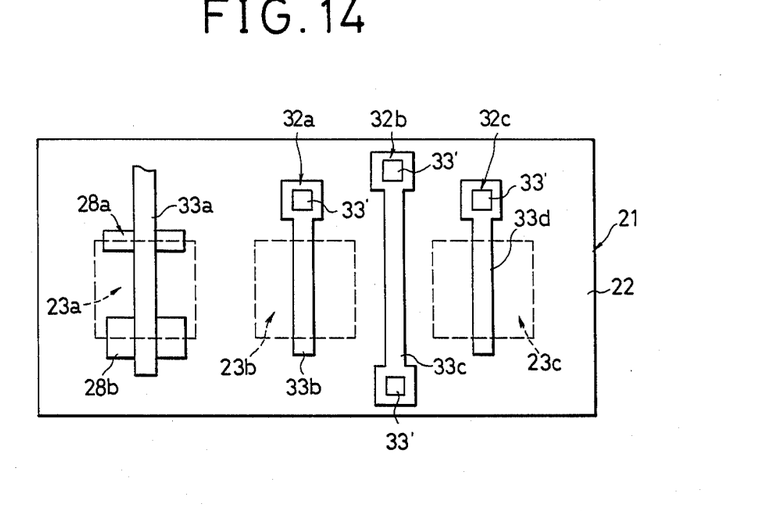

On the other hand, there is formed another second polysilicon layer portion 33c which is electrically connected to the first polysilicon layer 26b through the hole 32b provided above the field oxide 22c, as shown in FIG. 6. Of importance, except for the memory device region 23a, the first polysilicon layer 26 and the second polysilicon layer 33 are electrically connected to each other by means of vias provided in openings 32 formed through the second insulating layer 30. FIG. 14 shows in plan view the structure of FIG. 6. Again, it is to be noted with respect to FIG. 14 that the device region 23a is shown with 90° rotation in FIG. 14 as compared with FIG. 6; however, the second polysilicon layer portion 33a forming a control gate is shown in FIG. 14 without such rotation. Thus, the second polysilicon layer portion 33a of the memory device region 23a shown in FIG. 6 is provided as extending perpendicularly with respect to the plane of the drawing sheet. Accordingly, the second polysilicon layer portion 33a forming a control gate, in fact, extends across each of the cut-away portions 28a and 28b formed in the first polysilicon layer, as shown in FIG. 14. Besides, as shown in FIG. 14, the second polysilicon layer portions 33b, 33c and 33d are all electrically connected to the underlying first polysilicon layer 26b through the vias 33' formed by the second polysilicon material as filled in the holes 32a, 32b and 32c formed in the second insulating film.

Figure 7:
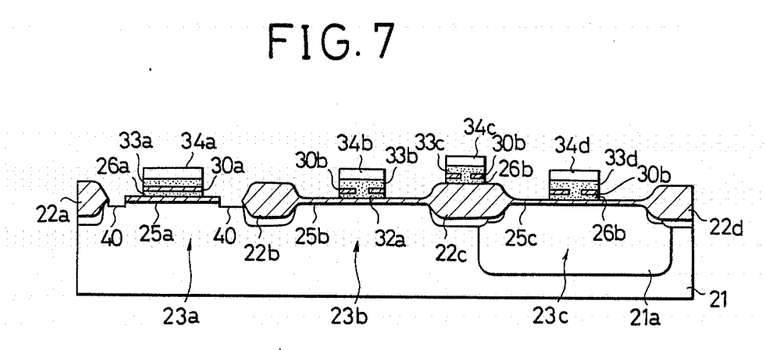
Figure 15:
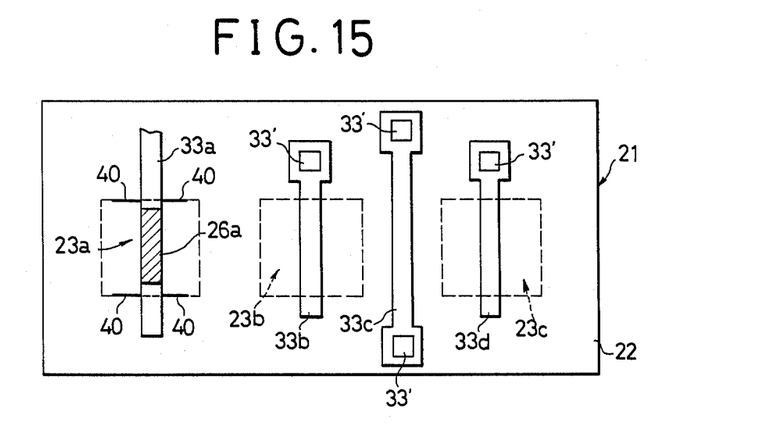

Then, using the remaining photoresist portions 34a through 34d after patterning and the underlying second polysilicon layer portions 33a through 33d as a mask, those portions of the second oxide film 30 and the underlying first polysilicon layer 26 which are not covered by such a mask are removed by etching to obtain a structure shown in cross section in FIG. 7. The plan view of the structure shown in FIG. 7 is shown in FIG. 15, and the relationship between FIGS. 7 and 15 is the same as that between FIGS. 6 and 14. Of importance with respect to the structure shown in FIG. 7, during the step of removing the unnecessary portions of the second insulating layer 30 and the first polysilicon layer 26 by etching, that portion of the silicon substrate in each of the device regions 23b and 23c in the non-memory, or peripheral, region has not received the damage often observed in the prior art device. During this etching step, on the other hand, since the thin first insulating layer 25a is partially exposed through the cut-away portions 28a and 28b and the first insulating layer 25a is approximately equal in thickness to the second insulating layer 30, during the step of removing the unnecessary portions of the second insulating layer 30 and the first polysilicon layer 26 by etching, damage is formed at 40 in the substrate surface in the memory device region 23a. However, as will be described later, such damage at 40 formed in the memory device region 23a does not cause a problem because it cannot produce a metal short between interconnection lines as observed in the prior art, or a metal short may be easily avoided since it is in the memory device region 23a. It is to be noted that the damage at 40 produced in the memory device region 23a appears only along the boundaries between the field oxide 22 and the first insulating layer 25 which have been exposed by the cut-away portions 28a and 28b provided in the memory device region 23a for patterning the first polysilicon layer. As a result of the above-described etching step, in the memory device region 23a there are formed the floating gate 26a and the gate electrode 33a which are electrically isolated from each other by the second insulating layer 30a sandwiched therebetween. On the other hand, in the non-memory region including the device regions 23b and 23c, there is formed a gate electrode comprising the first polysilicon layer portion 26 and the second polysilicon layer portion 33 which is electrically connected to the first polysilicon layer portion 26 through the hole provided in the second insulating layer 30b.

Figure 8:
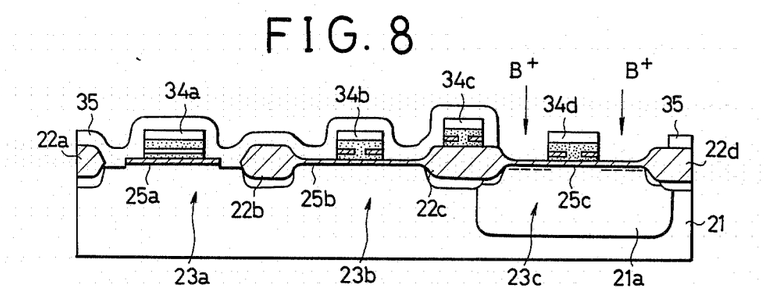
Figure 9:
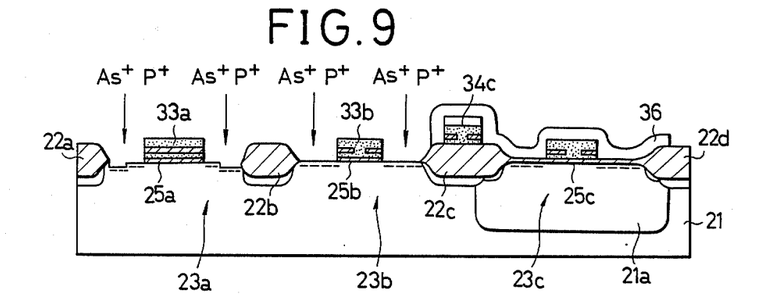
Figure 10:
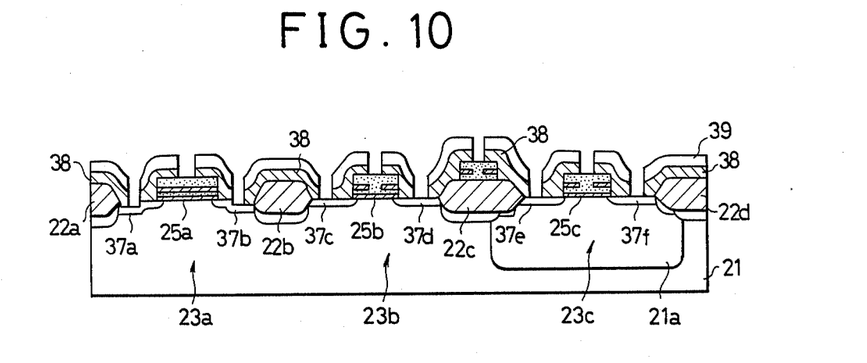
Figure 11:
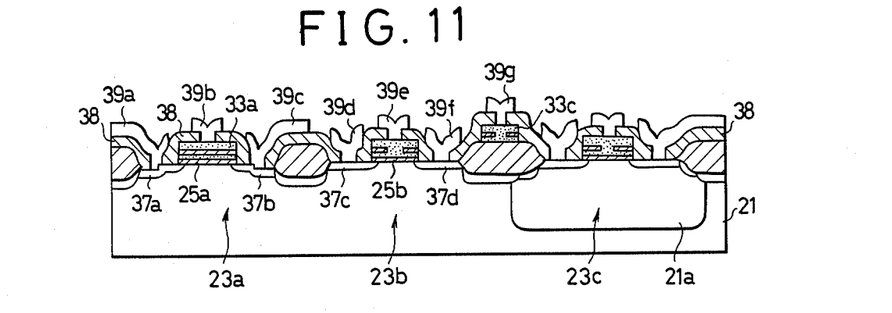

Thereafter, as shown in FIGS. 8 through 11, a well-known CMOS process may be applied to complete the semiconductor device. That is, as shown in FIG. 8, a photoresist layer 35 is formed across the entire surface of the structure shown in FIG. 7, and then that portion of the photoresist 35 which is located above the device region 23c in the well 21a is removed by etching to have the first insulting layer 25c exposed. Under the condition, impurities (boron in the illustrated example) opposite in conductivity type to the well 21a are introduced by ion implantation. Then, after removing the photoresist layer 35, another photoresist layer 36 is formed across the entire surface and then it is removed by etching excepting that portion located above the well 21a. The resulting structure is shown in FIG. 9. Under the condition, impurities (arsenic and phosphorus in the illustrated example) opposite in conductivity type to the substrate 21 are introduced by ion implantation. In particular, in the present embodiment, phosphorus ions are first introduced, and, then, arsenic ions are introduced. After ion implantation, the photoresist layer 36 is removed by etching, and, then, a PSG layer 38 is formed across the entire surface. On the surface of the PSG layer 38 is formed another photoresist layer 39, to which a well-known photoetching technique is applied to form contact holes in the PSG layer 38 at desired locations. In the meantime, the impurities introduced by ion implantation are diffused into the substrate 21 to define the respective diffused regions 37a–37f. Then, as shown in FIG. 11, after removal of the photoresist layer 39, a layer of metal such as aluminum is formed across the entire surface, and with the application of a well-known photoetching technique, the metal layer is patterned to form a desired interconnection pattern thereby completing the manufacturing process.

In the semiconductor device thus fabricated, the interconnection layer 39a, for example, is connected to the source/drain diffused region 37a and the line 39b is connected to the control gate 33a of memory transistor with the interconnection line 39c being connected to the source/drain diffused region 37b. Similarly, the lines 39d and 39e are connected to the source/drain diffused region 37c and the the gate of MOS transistor defined in the device region 23b, respectively, and the line 39f is connected to the remaining source/drain diffused region 37d. Moreover, the interconnection line 39g is connected to the buried interconnection line 33c.

As described above, in accordance with the present invention, that portion of the substrate which defines the diffused region of a transistor formed in the non-memory region is prevented from being damaged. Thus, even if a metal interconnection pattern is formed to interconnect numerous transistors in the non-memory region to define desired logic circuits such as decoders, there is no chance that different interconnection lines are undesirably shorted. In, accordance with the present manufacturing method, in the case of forming the second insulating layer of a memory transistor, the first polysilicon layer protectively covers the transistors other than the memory transistors, so that the threshold of each of the transistors to be formed in the non-memory region is prevented from being changed undesirably by autodoping. Furthermore, in the case of applying ion implantation, since the polysilicon layer defining each gate is relatively thick and yet there is a sandwiched second insulating layer in the polysilicon gate layer, there is no chance for implanted ions to reach the channel region by passing through the present polysilicon gate layer even if ion plantation is carried out at a relatively high energy level, which thus contributes to control the condition of the channel region. In addition, since the gate electrode of each of the peripheral transistors in the non-memory region other than the memory transistors in the memory region and the buried interconnection lines formed on field oxides have a larger cross-sectional area as compared with the prior art devices, they have a resistance value which is smaller than that of the typical prior art device by the factor of 0.6–0.8, which thus contributes to increase the operational speed of the device.

Figure 16:
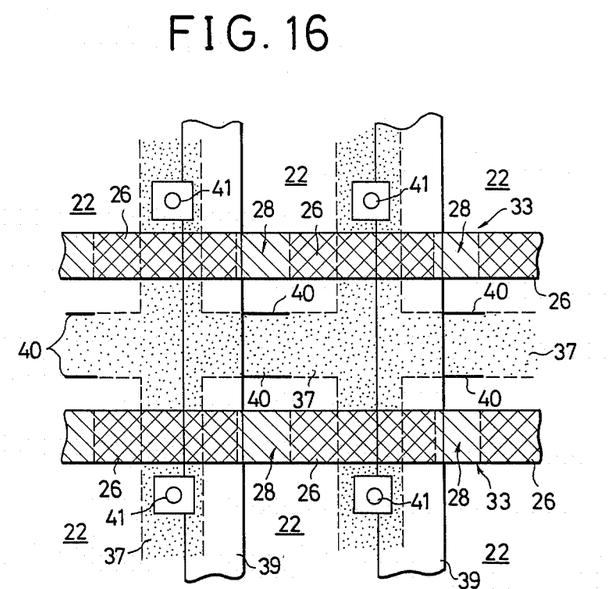
FIGS. 16 and 17 are schematic illustrations showing the detailed structure of the memory region in a semiconductor device constructed in accordance with one embodiment of the present invention.
Figure 17:
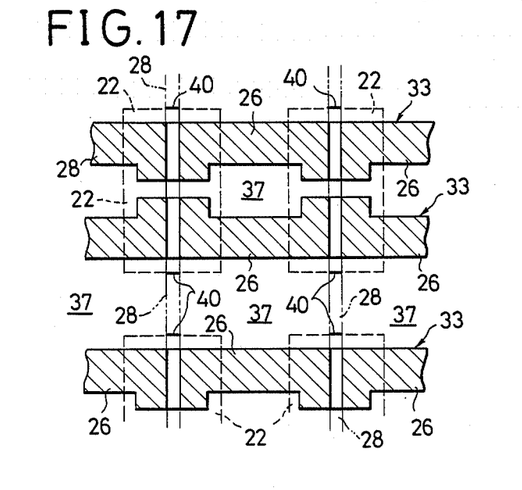

As described previously, in the memory device region, there are provided cut-away portions 28a and 28b for defining a floating gate, and, for this reason, the substrate surface becomes partly damaged and thus there is a possibility of forming an undesired metal pattern in the memory device region. However, as shown in FIGS. 16 and 17, in reality, the memory region has a relatively regular two dimensional structure, and the structure of the metal interconnection pattern is not complicated, as opposed to the non-memory, or peripheral, region, in which a rather complicated interconnection pattern is provided for forming desired logic circuits. Thus, the production of such damage in the memory region may be disregarded because it will not cause shorting of metal interconnection lines.

Described more in detail, FIGS. 16 and 17 each show a part of the memory region in a semiconductor memory device when actually fabricated on a one chip. In FIG. 16, a pair of control gates 33 runs horizontally, and below each of the control gates 33 is provided a plurality of floating gates 26, which are spaced apart from each other and electrically isolated from the control gate 33 by means of the second insulating layer sandwiched between the control gate 33 and the floating gates 26. Thus, in the memory region, the control gates 33 define word lines, one of which is selected by a decoder formed by the peripheral transistors. On the control gates 33 and across the entire surface is provided a PSG layer, on which, in turn, are provided metal interconnection lines 39, 39 vertically in FIG. 16. These metal interconnection lines 39 define bit lines in the memory region and they are used as data lines for writing data in or reading data from the selected memory transistor. The bit lines 39 are electrically connected to the respective source/drain diffused regions 37 which are formed in the substrate surface by diffusion through the contact holes 41 provided through the PSG layer. Therefore, in the case of writing data into a selected memory transistor (cell) the corresponding control gate (word line) 33 is rendered high and at the same time a selected metal line (bit line) 39 is rendered high to cause charges to be injected into the floating gate 26 of the memory transistor (cell) at the interconnection between these two selected lines thereby carrying out the write-in operation.

As described previously, in order to provide a plurality of discontinued floating gates 26 below the common control gate (word line) 33, the cut-away portion 28 is formed by selectively etching the first polysilicon layer, which will impart damage to the substrate surface partly along the boundary between the field oxide 22 and the diffused region 37 at locations indicated by 40 in FIG. 16. Thus, after the step of metallization, there is a possibility that metal will remain at these damaged locations 40. However, as mentioned previously and shown in FIG. 16, since the metal interconnection lines 39 run regularly in the direction perpendicular to the gate electrodes 26, these remaining metal portions 40 will not cause undesired shorting between metal lines 39. Therefore, in accordance with the present invention, even if the substrate surface is partially damaged and an undesired metal pattern is formed in the memory region, it will not be a cause of lowering the yield. On the other hand, in the peripheral region, in which peripheral transistors other than memory transistors are formed, the formation of such an undesired metal pattern should be avoided since interconnection lines having a varying and complicated pattern. As described in detail above, no such an undesired metal pattern is formed in accordance with the present manufacturing method.

FIG. 17 illustrates the condition in which the cut-away portions 28 are provided by selectively etching the first polysilicon layer to provide a plurality of floating gates 26 separated from each other under the common gate electrode (word line) 33 and the provision of such cut-away portions 28 causes damage 40 locally along the boundary between the field oxide 22 and the diffused region 37 with undesired metal remaining at these damaged portions 40 after the step of metallization.

It is to be noted that, as easily understood from FIG. 16, even if damage 40 occurs at the boundary between the diffused region 37 and the field oxide 22, it is possible to avoid the formation of an undesired metal pattern by suitably designing the contact 41 between the bit line 39 and the diffused region 37. That is, as described with reference to FIGS. 2a–2c, such an undesired metal pattern is formed at the damaged portions 40 when an etching solution reaches the damaged portions 40 when forming the contact holes in the PSG layer 39. Thus, as shown in FIG. 16, by having the contact holes located further away from the damaged portions 40 as much as possible, it is possible to prevent the etching solution from reaching the damaged portions 40. When so structured, even if damaged portions 40 are produced in the memory region, it is possible to prevent the metal from remaining at these damaged portions 40. As an example, the closest distance between the contact hole 41 and the damaged portion 40 should be set at 4–5 microns or more, preferably at 12–13 microns or more. Besides, it is preferable to locate the contact hole 41 at the center between the sides of the diffused region 37 as much as possible and furthermore at a location separated away from the boundary between the field oxide 22 and the diffused region 37 as much as possible.

While the above provides a full and complete disclosure of the preferred embodiments of the present invention, various modifications, alternate constructions and equivalents may be employed without departing from the true spirit and scope of the invention. For example, the semiconductor material and the conductivity of impurity used should not be limited only to those described above. The conductivity type may be reversed. Furthermore, the above-described embodiment includes a well formed in the semiconductor substrate, but the present invention is also applicable to the case without such a well. Therefore, the above description and illustration should not be construed as limiting the scope of the invention, which is defined by the appended claims.

What is claimed is:

1. A method for manufacturing a semiconductor device provided with a memory region including a floating gate type memory transistor and a non-memory region including an insulating gate type transistor, said method comprising the steps of:
   (a) forming a first polysilicon layer doped with a first predetermined impurity on a first insulating layer formed across the surface of a semiconductor substrate;
   (b) selectively etching said first polysilicon layer to form a desired pattern in said memory region while keeping said first polysilicon layer intact in said non-memory region;
   (c) forming a second insulating layer across the entire surface of said device;
   (d) forming a second polysilicon layer doped with a second predetermined impurity across the entire surface of said device;
   (e) patterning said second polysilicon layer both in said memory and non-memory regions; and
   (f) etching said second insulating layer and said first polysilicon layer using said patterned second polysilicon layer as a mask thereby forming a floating gate from said first polysilicon layer and a control gate from said second polysilicon layer in said memory region and forming a gate electrode of said insulating gate type transistor in said non-memory region, wherein said substrate is partly exposed in said memory region but is not exposed in said non-memory region, where said substrate remains covered by said first insulating layer.

2. A method of claim 1 wherein said first and second predetermined impurities are the same impurity.

3. A method of claim 3 wherein said same impurity is phosphorus.

4. A method of claim 1 wherein said memory region includes a plurality of said memory transistors arranged in the form of a two dimensional N×M matrix.

5. A method of claim 4 wherein said non-memory region includes a plurality of MOSFETs and said method further comprises a step of forming an interconnection for interconnecting said plurality of MOSFETs to define a desired logic circuit.

6. A method of claim 1, further comprising a step after said step (c) for selectively etching said second insulating layer to form at least one hole through said second insulating layer and thereby expose said first polysilicon layer through said at least one hole in said non-memory region, wherein said gate electrode of said insulating gate type transistor formed in said non-memory region includes said first and second polysilicon layers which are electrically connected through said at least one hole.

* * * * *